US007908527B2

(12) United States Patent
Kohara et al.

(10) Patent No.: US 7,908,527 B2
(45) Date of Patent: Mar. 15, 2011

(54) SEMICONDUCTOR INTEGRATED CIRCUIT AND REDUNDANCY METHOD THEREOF

(75) Inventors: Koji Kohara, Yokohama (JP); Takehiko Hojo, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 302 days.

(21) Appl. No.: 12/186,899

(22) Filed: Aug. 6, 2008

(65) Prior Publication Data
US 2009/0044045 A1 Feb. 12, 2009

(30) Foreign Application Priority Data

Aug. 8, 2007 (JP) ................................ 2007-206952

(51) Int. Cl.
*G11C 29/00* (2006.01)
(52) U.S. Cl. ..................... 714/711; 714/710; 365/201
(58) Field of Classification Search .......... 714/718–723, 714/710–711; 365/200–201
See application file for complete search history.

(56) References Cited

U.S. PATENT DOCUMENTS

| 5,430,679 | A  | * | 7/1995  | Hiltebeitel et al. | 365/200 |
| 5,812,466 | A  | * | 9/1998  | Lee et al. | 365/200 |
| 6,445,627 | B1 | * | 9/2002  | Nakahara et al. | 365/200 |
| 6,512,709 | B1 |   | 1/2003  | Nakahara et al. | |
| 6,538,924 | B2 | * | 3/2003  | Dono et al. | 365/185.08 |
| 6,804,156 | B2 | * | 10/2004 | Ito | 365/201 |
| 6,822,912 | B2 | * | 11/2004 | Shimizu et al. | 365/200 |
| 6,937,533 | B2 | * | 8/2005  | Hojo et al. | 365/200 |
| 7,106,640 | B2 | * | 9/2006  | Yoon et al. | 365/200 |
| 7,218,559 | B2 | * | 5/2007  | Satoh | 365/200 |
| 7,286,419 | B2 | * | 10/2007 | Doi | 365/200 |
| 7,313,038 | B2 | * | 12/2007 | Otsuka | 365/201 |
| 2006/0083085 | A1 | * | 4/2006 | Ikegami | 365/200 |
| 2007/0165467 | A1 | * | 7/2007 | Kohara | 365/200 |
| 2008/0137446 | A1 |   | 6/2008 | Kohara | |

FOREIGN PATENT DOCUMENTS

| JP | 61-45647      | 5/1986 |
| JP | 2000-013426   | 1/2000 |
| JP | 2002-025292   | 1/2002 |
| JP | 2002-198977   | 7/2002 |
| JP | 2003-085994   | 3/2003 |
| JP | 2004-133970   | 4/2004 |
| JP | 2007-193879   | 8/2007 |

OTHER PUBLICATIONS

Japanese Office Action for JP2007-206952 mailed on Aug. 25, 2009.
Japanese Office Action for 2007-206952 Mailed Aug. 31, 2010.

* cited by examiner

*Primary Examiner* — Robert Beausoliel
*Assistant Examiner* — Steve Nguyen
(74) *Attorney, Agent, or Firm* — Turocy & Watson, LLP

(57) ABSTRACT

A semiconductor integrated circuit includes a main memory cell array, redundancy memory cell array, memory macro and repair information transferring circuit. A repair information analyzing circuit fetches repair information of transferred unit repair information therein, outputs the repair information to the memory macro having a redundancy repair mechanism and subjects the memory macro to a redundancy repair process by the redundancy repair mechanism of the memory macro in a case where memory identification information of the transferred unit repair information coincides with memory identification information stored in a nonvolatile memory element.

12 Claims, 16 Drawing Sheets

Semiconductor integrated circuit (First embodiment)

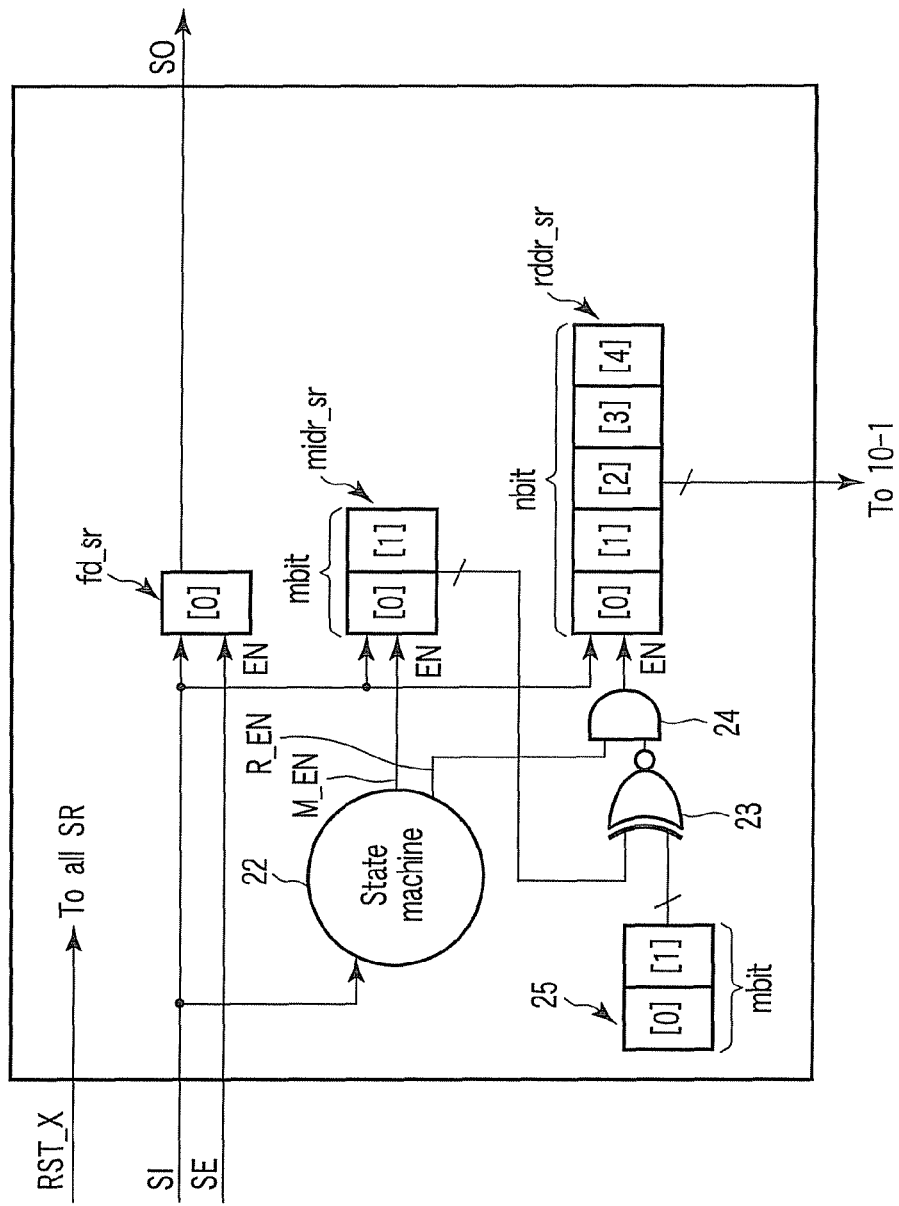
F I G. 3

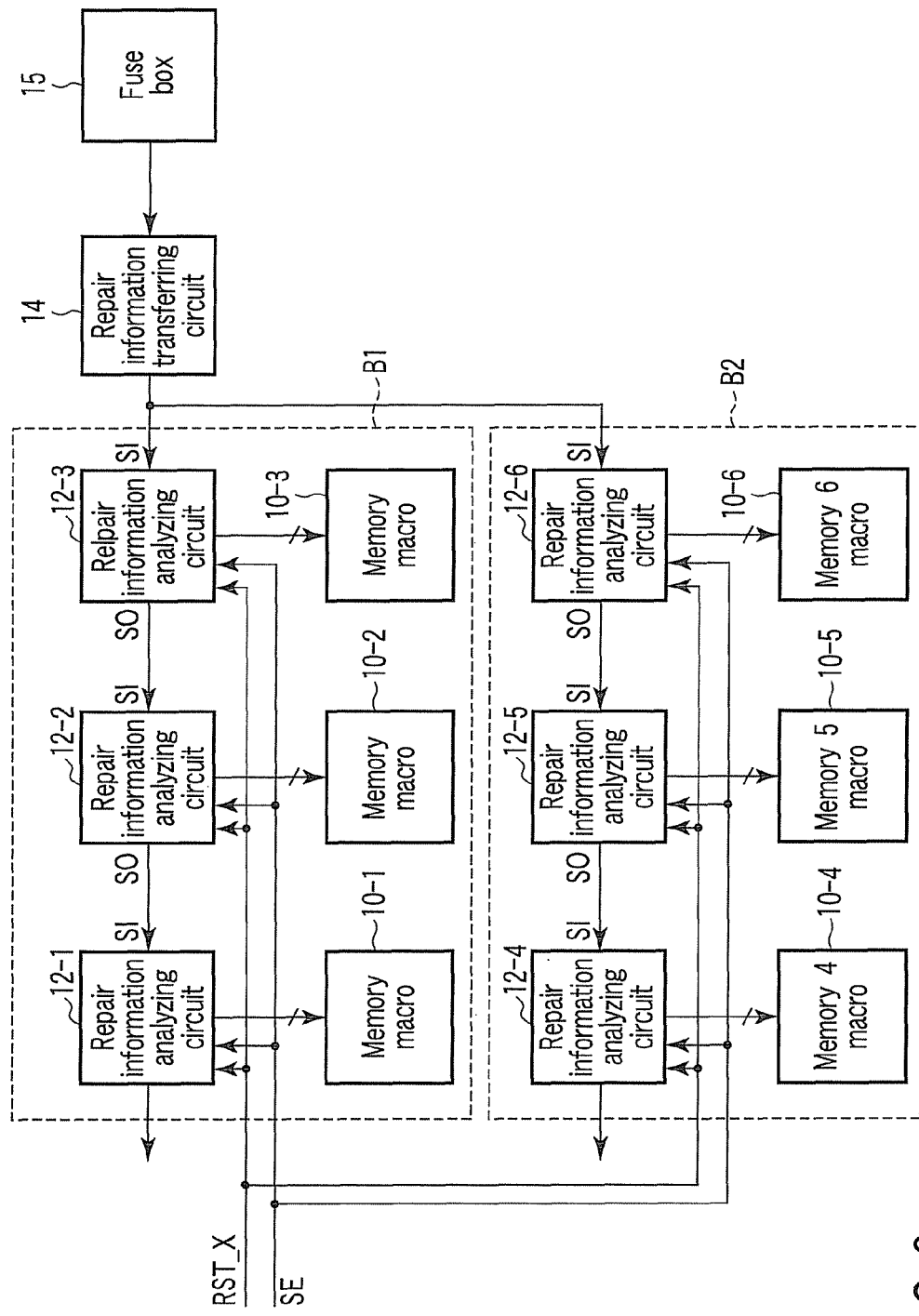
F I G. 8

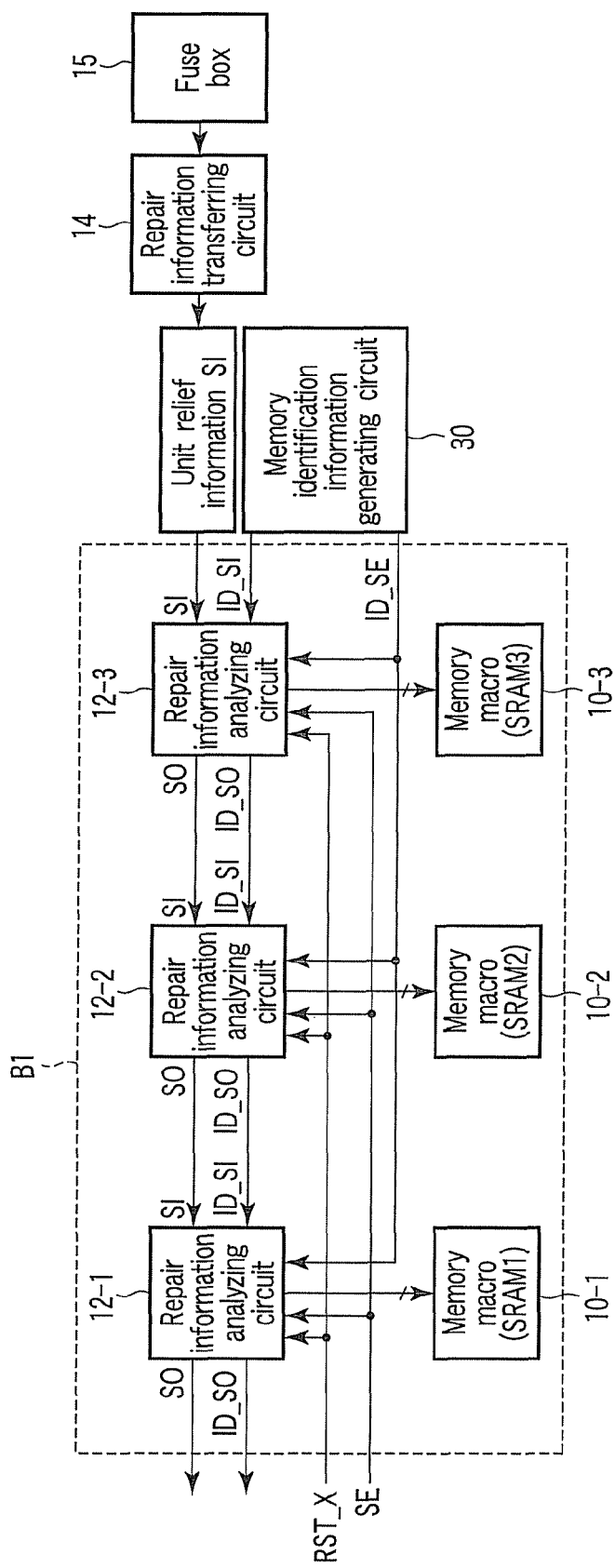
F I G. 10

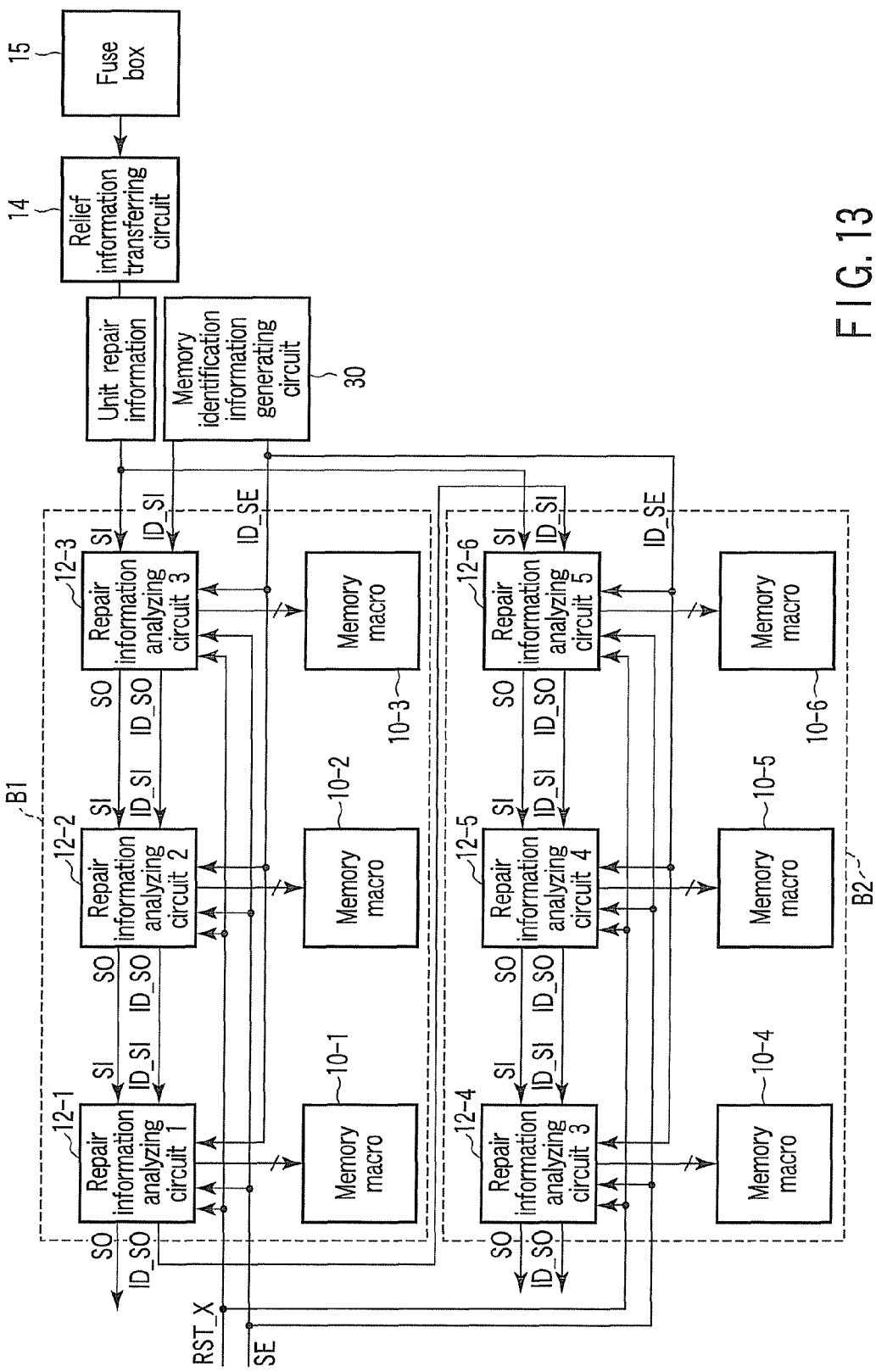
F I G. 13

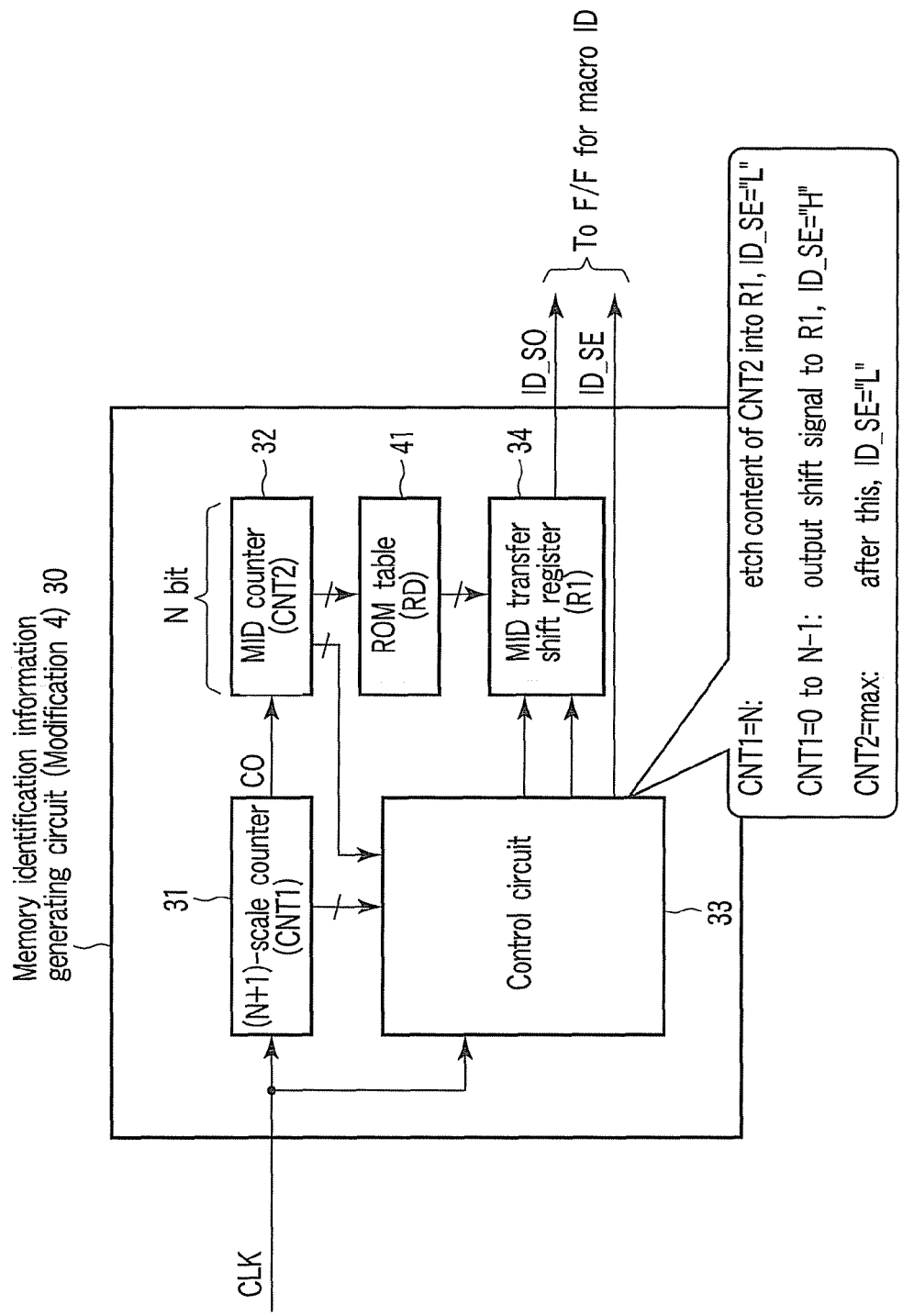
F I G. 15

SEMICONDUCTOR INTEGRATED CIRCUIT AND REDUNDANCY METHOD THEREOF

CROSS-REFERENCE TO RELATED APPLICATIONS

This application is based upon and claims the benefit of priority from prior Japanese Patent Application No. 2007-206952, filed Aug. 8, 2007, the entire contents of which are incorporated herein by reference.

BACKGROUND OF THE INVENTION

1. Field of the Invention

This invention relates to a semiconductor integrated circuit and a redundancy method thereof and, for example, to a redundancy method of a semiconductor integrated circuit having a memory macro buried therein or a system containing the memory macro.

2. Description of the Related Art

In a semiconductor integrated circuit, a buried memory macro (memory device) is designed with the finest dimensions and is a portion in which physical defects tend to occur in the manufacturing process. Since the memory macro is formed to have a regular pattern, a defective portion can be easily specified than in a random logical portion. Further, the redundancy relieving technique of relieving the defective portions by means of a redundancy configuration and shipping the integrated circuit in a good state is generally used. Since the defective portions to be relived are different for each integrated circuit manufactured, repair position information must be provided for each integrated circuit. In order to store the information, a fuse device that can be programmed only once or a rewritable nonvolatile memory device is used.

It is necessary to provide plural bits for the repair position information for each memory macro and the bit number thereof becomes different depending on the type of the memory macro and the configuration of word number, bit width and the like. For example, in the simplest case, the configuration can be attained by providing a storage device that can store the required number of bits on the integrated circuit. However, in the actual manufacturing process, the number of memory macros having defects is extremely smaller in comparison with the total number of memory macros and, for example, one to three devices among several hundred devices in total are provided in many cases. Therefore, it is uneconomical from the viewpoint of area cost to provide a repair position information storage device on the integrated circuit on the assumption that all of the memory macros can be relieved.

In order to solve the above problem, a configuration of providing the repair position information and device recognition information used to determine a memory macro to which the repair position information corresponds is proposed so as to reduce the required number of storage bits in the storage device. With this configuration, the size of the storage device required for each memory macro is increased. However, since it is only required to store information indicating only the number of repair information items estimated as the maximum required number, the number of information items can be remarkably reduced in comparison with a case wherein information items for all of the memory macros are stored.

In this case, several variations of a method for giving data to a memory macro to be actually relieved based on the reduced number of stored information items are considered. For example, basically, the configuration of providing repair information required only for a corresponding memory macro based on a memory macro identification information portion of the storage information becomes necessary. For example, the configuration is considered in which a decode circuit is provided in the output portion of a repair information storage device, desired repair information is supplied to a memory macro indicated by device identification information and non-repair information is supplied to other memory macros free from defects. Data can be transferred from the repair information storage device to the memory macro in parallel or in series. However, with the above configuration, if the number of memory macros (memory devices) or the configuration of the memory macro is changed, there occurs a problem that the decode circuit must be reconfigured.

As the configuration of solving the above problem, for example, the configuration in which repair information analyzing circuits are provided in respective memory macros (memory devices) is proposed. With this configuration, even if the number of memory macros or the configuration of the memory macro is changed, it is only required to add or omit a repair information analyzing circuit. Therefore, even if the number of memory macros or the configuration of the memory macro is changed, it is not necessary to reconfigure the decode circuit.

However, with the above configuration, it is necessary to repeatedly transfer repair information plural times for respective memory macros when the number of bits of the repair information of each memory macro is different. Therefore, for example, clocks corresponding to the different numbers of bits are further required to transfer unit repair information items and unit repair information is required to be repeatedly transferred plural times corresponding to the number of unit repair information items to be transferred as the whole system.

There is also provided a method for transferring unit repair information via a bus (for example, see Jpn. Pat. Appln. KOKAI Publication No. 2003-85994). However, with this method, interconnections in the chip become complicated and the control operation of fetching data from the bus becomes complicated when the number of memory macros is large.

BRIEF SUMMARY OF THE INVENTION

According to one aspect of the present invention, there is provided a semiconductor integrated circuit including a memory macro which includes a main memory cell array having a plurality of memory cells, a redundancy memory cell array having a plurality of redundancy cells and a redundancy repair mechanism; a repair information analyzing circuit having a nonvolatile memory element which stores memory identification information used to identify the memory macro; and a repair information transferring circuit which transfers unit repair information configured by at least the memory identification information and repair information to the repair information analyzing circuit, the repair information analyzing circuit fetching the repair information of the transferred unit repair information therein, outputting the repair information to the memory macro having the redundancy repair mechanism and subjecting the memory macro to a redundancy repair process by means of the redundancy repair mechanism of the memory macro in a case where the memory identification information of the transferred unit repair information coincides with the memory identification information stored in the nonvolatile memory element.

According to another aspect of the present invention, there is provided a semiconductor integrated circuit including a memory macro which includes a main memory cell array having a plurality of memory cells, a redundancy memory cell array having a plurality of redundancy cells and a redundancy repair mechanism; a repair information analyzing circuit having a register which stores memory identification information used to identify the memory macro; a repair information transferring circuit which transfers unit repair information configured by at least the memory identification information and repair information to the repair information analyzing circuit, and a memory identification information generating circuit which generates the memory identification information to be stored in the register and transfers the thus generated memory identification information to the register; wherein the repair information analyzing circuit fetches the repair information of the transferred unit repair information therein, makes a replacement to the redundancy cell according to the repair information and relieves the memory macro in a case where the memory identification information of the transferred unit repair information coincides with the memory identification information stored in the register.

According to still another aspect of the present invention, there is provided a redundancy method of a semiconductor integrated circuit including fetching repair information of unit repair information transferred therein in a case where memory identification information of the transferred unit repair information coincides with memory identification information stored in a nonvolatile memory element; outputting the repair information to a memory macro having a redundancy repair mechanism; and subjecting the memory macro to a redundancy repair operation by means of the redundancy repair mechanism of the memory macro.

BRIEF DESCRIPTION OF THE SEVERAL VIEWS OF THE DRAWING

FIG. 3 is a block diagram showing a repair information analyzing circuit in the first embodiment;

FIG. 8 is a diagram showing a semiconductor integrated circuit according to a first modification;

FIG. 10 is a block diagram showing a semiconductor integrated circuit according to a second embodiment of this invention;

FIG. 13 is a diagram showing a semiconductor integrated circuit according to a third modification;

FIG. 15 is a block diagram showing a memory identification information generating circuit in the fourth modification.

DETAILED DESCRIPTION OF THE INVENTION

There will now be described embodiments of the present invention with reference to the accompanying drawings. In the explanation, common reference symbols are attached to common portions throughout the drawings.

First Embodiment

A semiconductor integrated circuit according to a first embodiment of this invention is explained with reference to FIGS. 1 to 7.

1. Example of Whole Configuration

Figure 1:
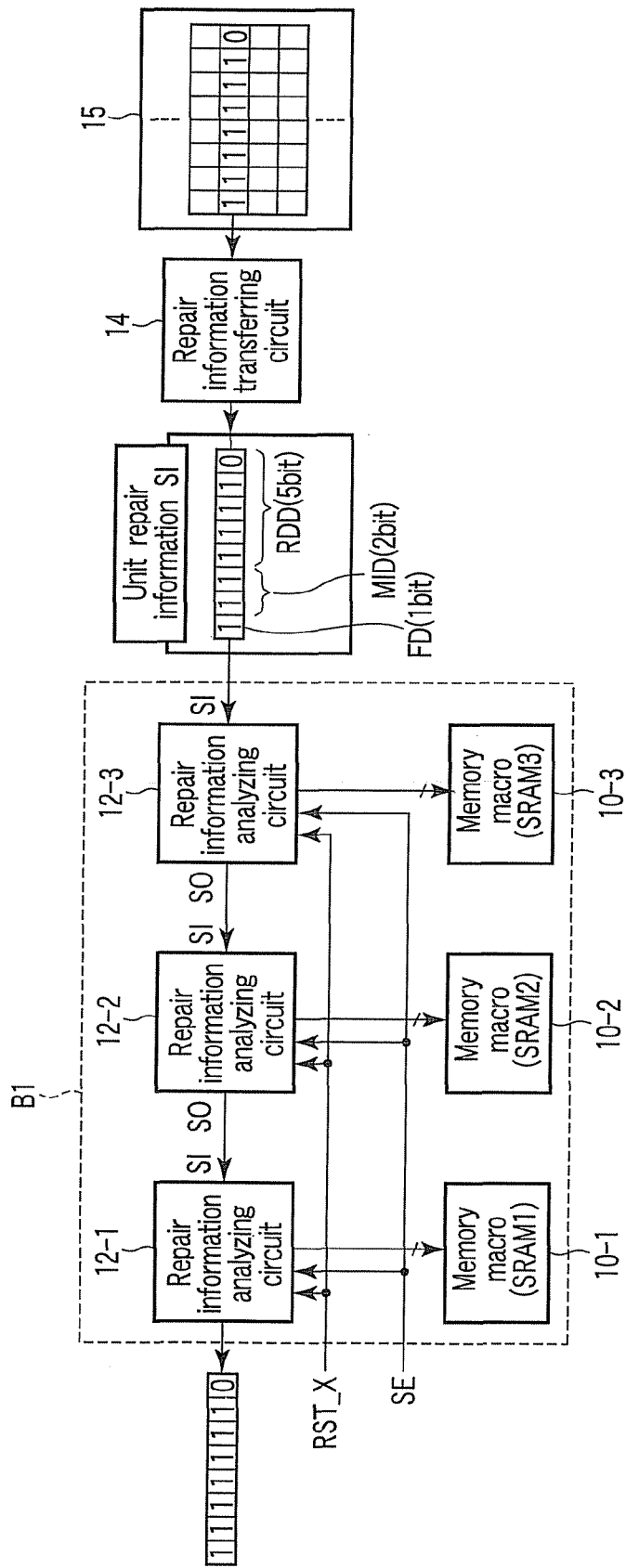
FIG. 1 is a block diagram showing a semiconductor integrated circuit according to a first embodiment of this invention.

First, an example of the whole configuration of the semiconductor integrated circuit according to this embodiment is explained with reference to FIG. 1. As shown in FIG. 1, the semiconductor integrated circuit according to this embodiment includes a fuse box 15, repair information transferring circuit 14 and memory block B1.

The fuse box 15 includes a plurality of fuses into which "0" information or "1" information can be stored and, in this example, 8-bit unit repair information is stored. As the fuse, a fuse device that can be programmed only once or rewritable nonvolatile memory device is used.

Unit repair information S1 includes mark information FD (one bit), memory identification information MID (two bits) and repair information RDD (five bits).

As will be described later, the mark information FD is information used as a mark at which state machines of repair information analyzing circuits 12-1 to 12-3 start state transition. That is, in the case of this example, when "1" is given to the mark information FD, the state machine starts state transition.

The memory identification information MID is information used to identify memory macros 10-1 to 10-3 and information inherent to each of the memory macros 10-1 to 10-3. For example, in the case of this example, the memory identification information MID of the memory macro 10-1 is "01", the memory identification information MID of the memory macro 10-2 is "10" and the memory identification information MID of the memory macro 10-3 is "11".

The repair information RDD is redundancy information such as redundancy addresses in the memory macros 10-1 to 10-3.

The repair information transferring circuit 14 transfers the unit repair information S1 to the repair information analyzing circuits 12-1 to 12-3.

The memory block B1 includes the memory macros 10-1 to 10-3 and repair information analyzing circuits 12-1 to 12-3.

As will be described later, the memory macros 10-1 to 10-3 each include a main memory cell array having a plurality of memory cells, a redundancy memory cell array having a plurality of redundancy cells, and a redundancy repair mechanism that can make a replacement to the redundancy memory cell array when a defective cell is present in the main memory cell array. Further, in this example, the memory macros 10-1 to 10-3 are SRAMs (Static Random Access Memories) (SRAM1 to SRAM3).

The repair information analyzing circuits 12-1 to 12-3 include nonvolatile memory elements (not shown) that store memory identification information items MID used to identify at least the memory macros 10-1 to 10-3.

Further, when the memory identification information MID in the transferred unit repair information S1 coincides with the memory identification information stored in the nonvolatile memory element, each of the repair information analyzing circuits 12-1 to 12-3 fetches repair information RDD in the transferred unit repair information S1 therein, outputs the repair information RDD and performs the redundancy repair operation of the memory macro by means of the redundancy repair mechanism of the memory macro.

2. Example of Configuration of Memory Macro

Next, an example of the configuration of the memory macro is explained with reference to FIG. 2. In this example, a case wherein the memory macro 10-1 (SRAM1) is taken as an example is explained.

Figure 2:
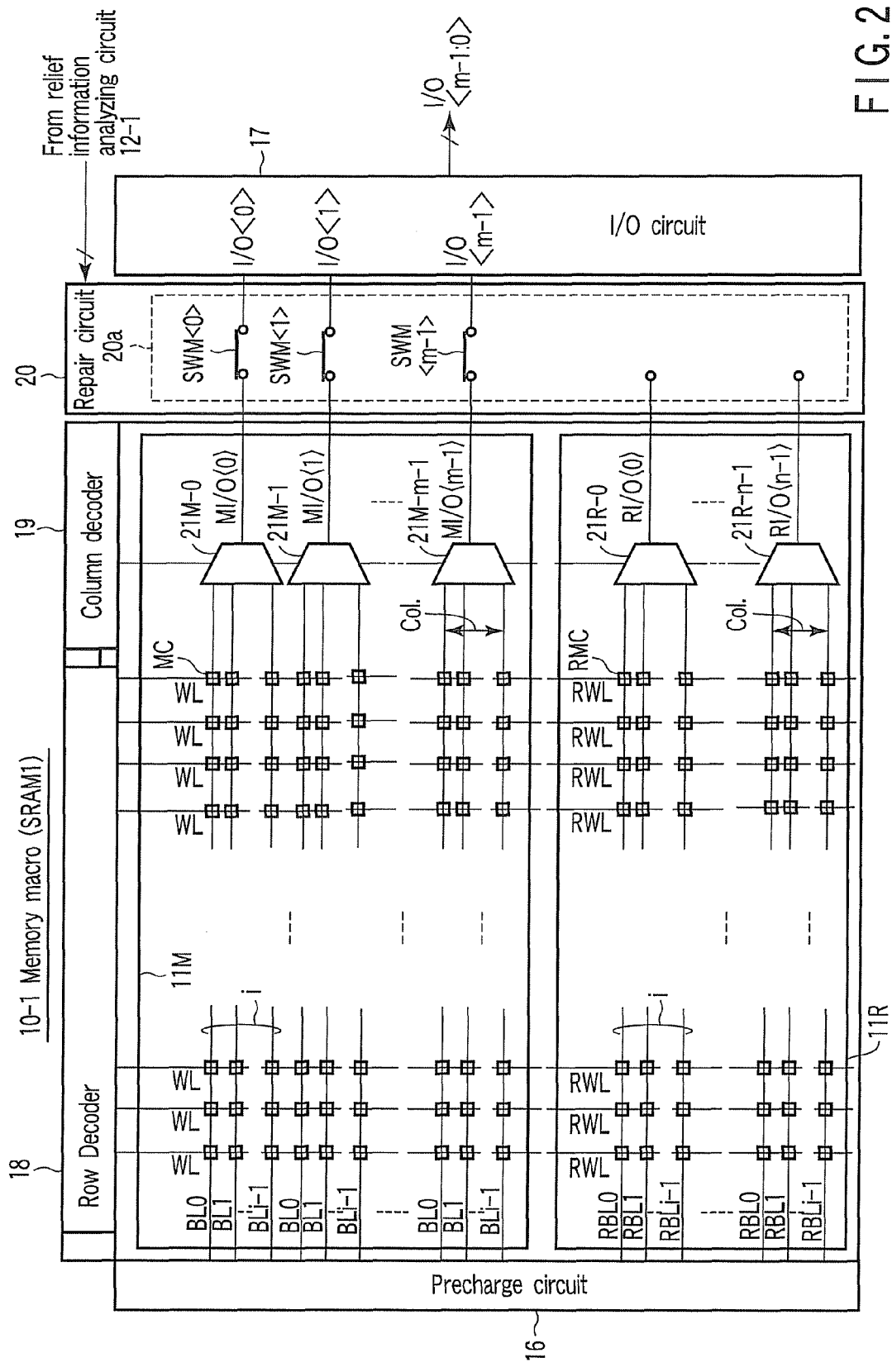
FIG. 2 is a block diagram showing a memory macro in the first embodiment.

As shown in FIG. 2, the memory macro 10-1 includes a main memory cell array 11M, redundancy memory cell array 11R, precharge circuit 16, I/O circuit 17, row decoder 18, column decoder 19 and redundancy repair circuit 20.

The main memory cell array 11M has memory cells MC arranged in intersecting positions between word lines WL and bit line pairs BL0 to BLi−1 in a matrix form and selectors 21M-0 to 21M-m−1. The selectors 21M-0 to 21M-m−1 each select one bit line pair according to a column address and simultaneously access the memory cells MC of the I/O width.

The redundancy memory cell array 11R has redundancy cells RMC arranged in intersecting positions between redundancy word lines RWL and redundancy bit line pairs RBL0 to RBLi−1 in a matrix form and selectors 21R-0 to 21R-n−1. Likewise, the selectors 21R-0 to 21R-n−1 each select one bit line pair according to a column address and simultaneously access the redundancy cells RMC of the I/O width.

The precharge circuit 16 is arranged at one-side ends of the bit line pairs BL0 to BLi−1 and redundancy bit line pairs RBL0 to RBLi−1 and applies preset voltages to the bit line pairs BL0 to BLi−1 and redundancy bit line pairs RBL0 to RBLi−1 at preset timings.

The I/O circuit 17 is a circuit to input/output data with respect to the exterior.

The row decoder 18 is arranged at one-side ends of the word lines WL and redundancy word lines RWL to select the word lines WL and redundancy word lines RWL.

The column decoder 19 is arranged at one-side ends of the selectors 21M-0 to 21M-m−1 and 21R-0 to 21R-n−1 to make a switching between the selectors 21M-0 to 21M-m−1 and 21R-0 to 21M-n−1 according to a column signal.

The repair circuit (redundancy repair mechanism) 20 controls an internal selection circuit 20a according to information transferred from the repair information analyzing circuit 12-1 at the redundancy operation time.

The selection circuit 20a selectively connects the main memory cell array 11M and redundancy memory cell array 11R to the I/O circuit 17 according to the control operation of the repair circuit 20. In the case of this example, the selection circuit 20a includes main switches SWM<0> to SWM<m−1>. For example, the main switches SWM<0> to SWM<m−1> may be each configured by a 2-to-1 selector. Further, as shown in the drawing, the selection circuit 20a selects only the main memory cell array 11M when no defective cell is present or before the redundancy operation is performed (a state in which MI/O<0> to MI/O<m−1> are connected to I/O<0> to I/O<m−1> by means of SWM<0> to SWM<m−1>).

In the case of this example, each of the memory cells MC and redundancy cells RMC is an SRAM cell configured by transfer transistors and inverter circuits connected in a flip-flop fashion to store data although not shown in the drawing.

3. Example of Configuration of Repair Information Analyzing Circuit

Next, an example of the configuration of the repair information analyzing circuit is explained with reference to FIG. 3. In this example, a case wherein the repair information analyzing circuit 12-1 is taken as an example is explained. The repair information analyzing circuit 12-1 is supplied with unit repair information as shift-in data SI and outputs unit repair information as shift-out data SO. Further, it is reset to the initial state when a reset signal RST_X is input thereto.

As shown in FIG. 3, the repair information analyzing circuit 12-1 includes a data transfer register fd_sr, memory identification information storage register midr_sr, repair information storage register rddr_sr, state machine 22, nonvolatile memory element 25, XNOR circuit 23 and AND circuit 24. The above circuits are all synchronizing circuits but the clock signal is omitted and is not shown.

The data transfer register fd_sr sequentially and temporarily stores the transferred unit repair information SI for each bit and outputs the same to the next circuit.

The memory identification information storage register midr_sr stores memory identification information MID among the transferred unit repair information SI. In the case of this example, the bit number of the memory identification information storage register midr_sr is two bits but, for example, it may be set to another desired bit number (m bits).

The repair information storage register rddr_sr stores repair information RDD among the transferred unit repair information SI. In the case of this example, the bit number of the repair information storage register rddr_sr is five bits but, for example, it may be set to another desired bit number (n bits).

The state machine 22 determines the fetching state of information into the registers midr_sr and rddr_sr. The input terminal of the state machine 22 is connected to receive shift-in data SI and the output terminals thereof are respectively connected to a shift enable signal terminal of the memory identification information storage register midr_sr and the AND circuit 24.

The nonvolatile memory element 25 stores fixed memory identification information MID. The memory identification information MID stored in the nonvolatile memory element 25 is provided at the design stage, for example. Further, the nonvolatile memory element may be formed with a simple configuration such as a ROM that is connected to a power source or GND according to the storage value of "1" or "0".

The input terminals of the XNOR circuit 23 are respectively connected to the output terminal of the nonvolatile memory element 25 and the output terminal of the memory identification information storage register midr_sr.

The input terminals of the AND circuit 24 are respectively connected to the output terminal of the XNOR circuit 23 and the output terminal of the state machine 22 and the output terminal thereof is connected to the shift enable signal terminal of the repair information storage register rddr_sr.

The XNOR circuit 23 configures a comparator circuit that performs a comparing operation to determine whether or not the memory identification information MID in the transferred unit repair information SI coincides with the memory identification information MID stored in the nonvolatile memory element 25.

In the case of this example, the register fd_sr is a shift register that shifts data when a shift enable signal SE is effective and the registers midr_sr and rddr_sr are shift registers that shift data when outputs of the state machine 22 and AND circuit 24 are effective. Shift-in data SI is input to the respective registers fd_sr, midr_sr, rddr_sr.

The bit numbers of the memory identification information storage register midr_sr and repair information storage register rddr_sr are not limited to the case of this example and can be realized by use of the same circuit configurations when the bit numbers are changed. Further, the bit number of the repair information storage register rddr_sr may be different for each memory macro, but in the following explanation, it is supposed that the bit number is kept constant for simplicity of the explanation. When the bit number of the repair information storage register rddr_sr is different, the upper bits of the transferred repair information RDD are pushed out by the shift operation and the lower bits of a number corresponding to the bit number of the repair information storage register rddr_sr remains in the repair information storage register rddr_sr. Therefore, a measure is taken by previously inserting necessary repair information into the lower bits of the transferred repair information RDD.

Further, in the case of this embodiment, since the memory identification information MID stored in the nonvolatile memory element 25 is stored as a fixed value, it is not necessary to control the same from the exterior.

4. State Transition of State Machine

Figure 4:
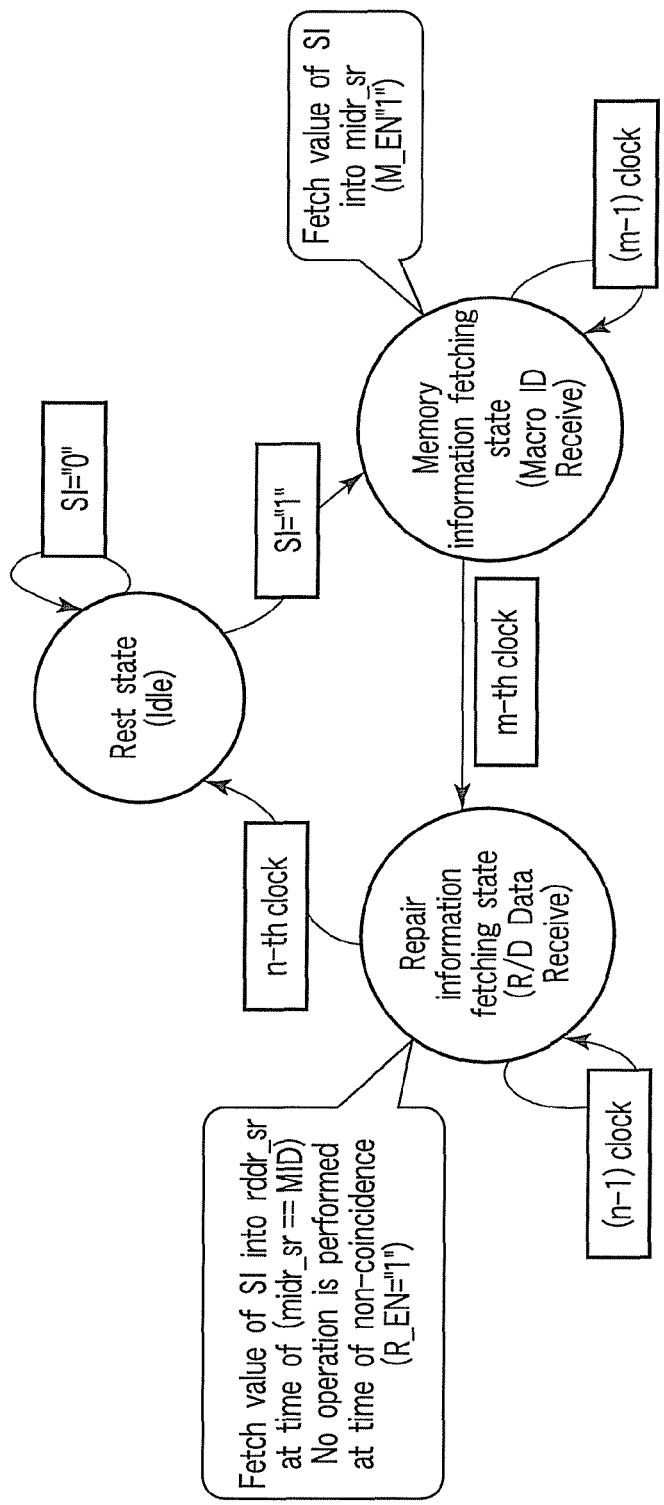
FIG. 4 is a diagram showing state transition of a state machine in the first embodiment.

Next, the state transition of the state machine 22 is explained with reference to FIG. 4.

The state machine 22 is set in a rest state (Idle) before unit repair information SI is input or when the sift-in data SI is "0".

Then, the state machine 22 starts state transition in response to reception of mark information FD when "1" is given to the mark information FD used as a mark in the transferred unit repair information SI and is set into a memory information fetching state (MIDR state). The memory information fetching state is a state in which the transferred memory identification information MID is fetched into the memory identification information storage register midr_sr in a (m−1) clock period. In the memory identification information fetching state, a shift enable signal M_EN of the register midr_sr is set to "1" and the memory identification information MID in the unit repair information SI is fetched into the register midr_sr.

Next, the state machine 22 is set into a repair information fetching state (RDDR state) in which transferred repair information RDD is fetched in a (n−1) clock period. In the repair information fetching state, the input R_IN of the AND circuit 24 is set to "1" and repair information RDD in the unit repair information SI is fetched into the register rddr_sr only when information in the memory identification information storage register midr_sr coincides with the memory identification information MID stored in the nonvolatile memory element 25 (midr_sr=MID). When the information items do not coincide with each other, the other input of the AND circuit 24 is set to "0" and the content of the register rddr_sr is kept unchanged.

5. Redundancy Operation

Next, the redundancy operation of the semiconductor integrated circuit according to this embodiment is explained with reference to FIGS. 5 to 7. The explanation is made according to FIG. 5. Further, it is supposed that the memory identification information items MID "01", "10", "11" inherent to the memories are provided for the memory macros 10-1 to 10-3 as described above.

(Clocks 1 to 2)

First, it is assumed that "1 01 11010" is transferred as unit repair information SI for the memory macro 10-1 from the repair information transferring circuit 14. In this case, in a period of clocks 1 to 2, each of the state machines 22 in the repair information analyzing circuits 12-1 to 12-3 fetches memory identification information MID"01" succeeding to head mark information FD"1" into the memory identification information storage register midr_sr with the head mark information FD"1" used as a mark in a period of clocks 1 to 2 (midr_sr[0], midr_sr[1]).

Figure 6:
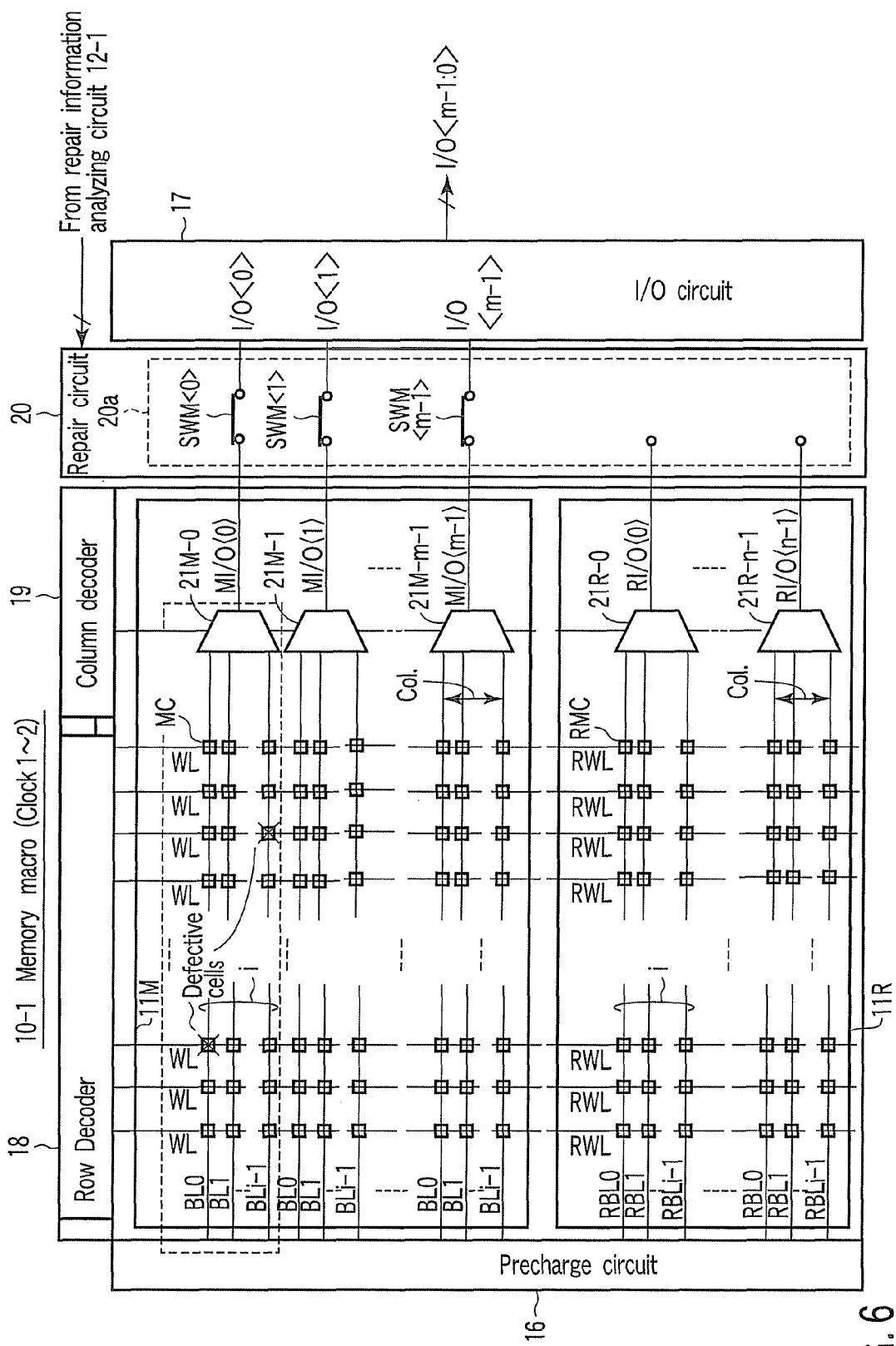
FIG. 6 is a diagram for illustrating one redundancy operation of the semiconductor integrated circuit according to the first embodiment.

In this case, as shown in FIG. 6, it is supposed that a defective cell is present in the I/O address I/O 0 of the main memory cell array M11 in the memory macro 10-1. At this time, no replacement is performed.

(Clocks 3 to 7)

Then, the state machine 22 fetches the following repair information RDD"11010" into the repair information storage register rddr_sr (rddr_sr[0] to rddr_sr[4]) only when the fetched memory identification information MID"01" coincides with the memory identification information stored in the nonvolatile memory element 25 inherently provided therefor. In the memory macros 10-2, 10-3 in which the memory identification information items do not coincide with each other, the values of the repair information storage registers rddr_sr are kept unchanged.

Figure 7:
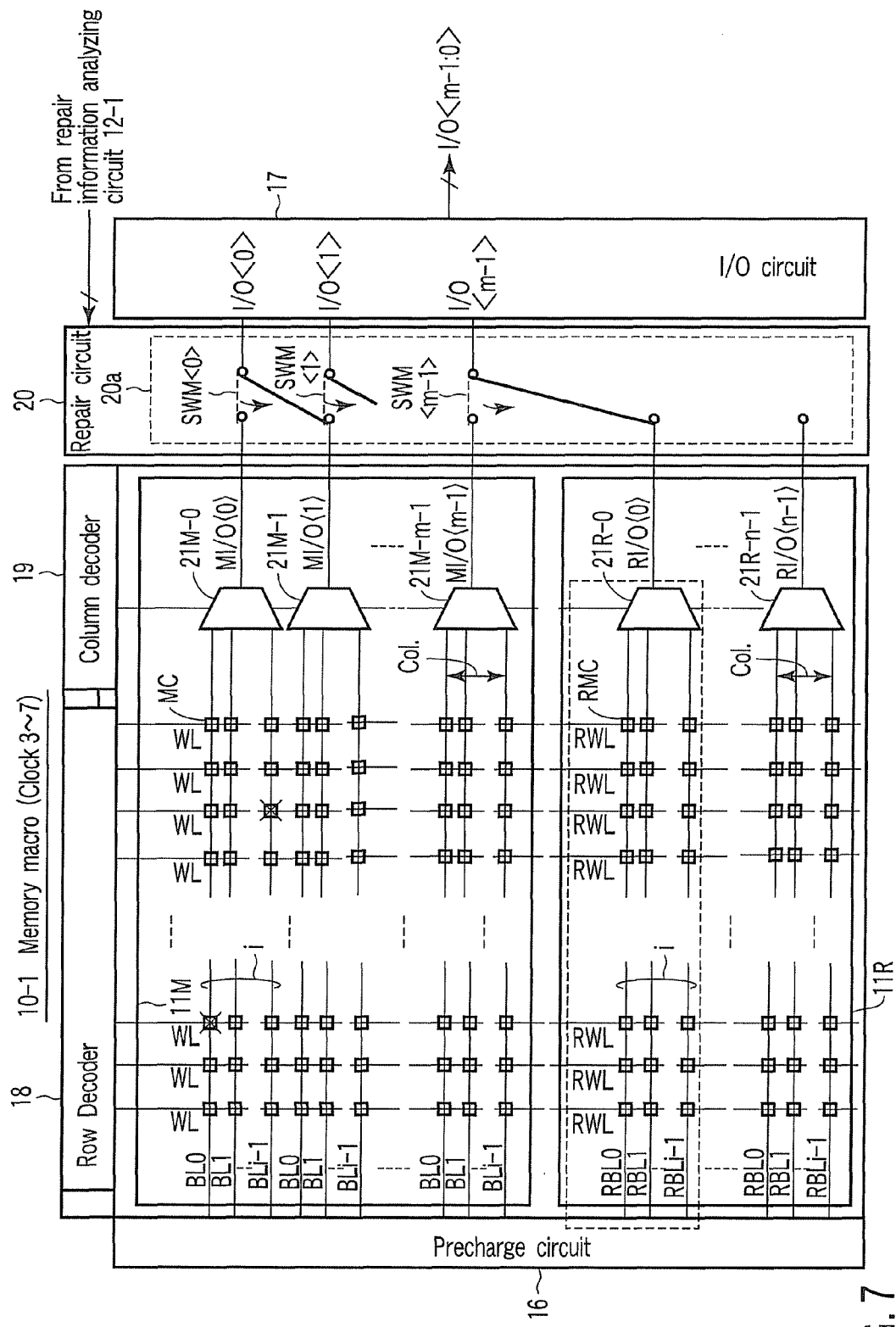
FIG. 7 is a diagram for illustrating one redundancy operation of the semiconductor integrated circuit according to the first embodiment.

At this time, as shown in FIG. 7, the row decoder 17 performs a preset replacement operation and a repair operation according to the repair information RDD"11010" transferred from the repair information analyzing circuit 12-1.

That is, the repair circuit 20 separates MI/O<0> connected to the main memory cell array containing a defective cell by switching the main switch SWM<0> and connects the same to the adjacent MI/O 1. Likewise, the repair circuit 20 sequentially switches MI/O<1> to MI/O<1> by means of the main switch SWM<1>, . . . , and switches MI/O<m−1> to RI/O<0> by means of the main switch SWM<m−1>. Therefore, the main memory cell array corresponding to the I/O address I/O 0 containing the defective cell can be replaced by the main memory cell array corresponding to the I/O address I/O 1 containing no defective cell and thus can be relieved.

(Clocks 8 to 15)

Next, the same operation as the above operation is performed when unit repair information SI "1 11 11110" for the memory macro 10-3 is successively transferred from the repair information transferring circuit 14. In this case, repair information RDD in the unit repair information SI is transferred to the object memory macro 10-3 and the other memory macros 10-1, 10-2 keep the initial state and continuously hold repair information RDD previously transferred.

Figure 5:
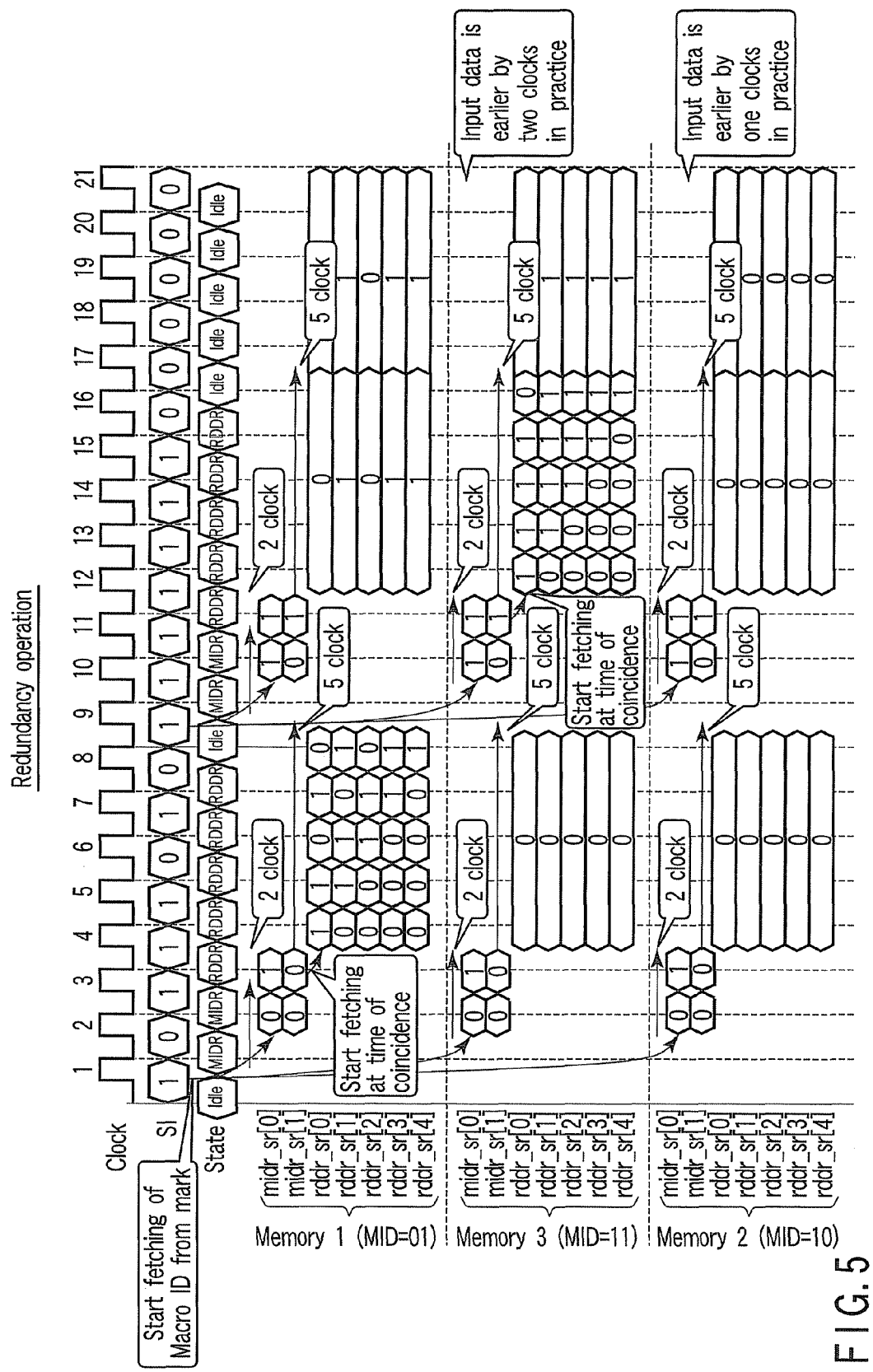
FIG. 5 is a diagram for illustrating the redundancy operation of the semiconductor integrated circuit according to the first embodiment.

In the above explanation, all of the repair information analyzing circuits 12-1 to 12-3 are operated at the same timing in FIG. 5. However, in practice, since the memory macros 10-1 to 10-3 are serially connected, the memory macro 10-3 is operated at timing two clocks earlier with respect to the memory macro 10-1 and the memory macro 10-2 is operated at timing one clock earlier with respect to the memory macro 10-1. Further, the number of clocks required for transfer is set to (k×l+m) clocks where the length of the unit repair information SI is k, the number of unit repair information items SI to be transferred is 1 and the number of memory macros serially connected is m.

6. Effect of Present Embodiment

According to the semiconductor integrated circuit of this embodiment and the redundancy operation thereof, at least the following effects (1) to (3) can be attained.

(1) It is advantageous in enhancing the operation speed.

As described above, when the memory identification information MID in the transferred unit repair information SI coincides with the memory identification information stored in the nonvolatile memory element 25, the repair information analyzing circuits 12-1 to 12-3 in this example can fetch the repair information RDD in the transferred unit repair information SI, make a replacement to a redundancy cell RMC according to the repair information RDD and relieve the memory macros 10-1 to 10-3.

Therefore, even when the bit numbers of the unit repair information items SI of the memory macros 10-1 to 10-3 are different, it is not necessary to repeatedly transfer the unit repair information SI for each memory macro and it is sufficient to perform the transfer operation only once. Therefore, for example, clocks of the different bit numbers are not required to transfer the unit repair information SI and the number of clocks can be reduced. Further, since it is not necessary to repeatedly transfer the unit repair information SI by the number of unit repair information items SI to be transferred as a whole system, the unit repair information SI can be transferred only in one transfer operation.

As a result, it is advantageous in enhancing the operation speed according to the configuration of this example.

(2) It is advantageous for miniaturization.

If the configuration is made in which it is necessary to repeatedly transfer repair information by the number corresponding to the number of memory macros, bits of a number corresponding to the number of memory macros are required for unit repair information. For example, in a comparison example described later, (R1+R2+R3) bits are required in addition to eight bits. Therefore, the area of the fuse box is increased and the occupied area of the whole system is increased.

In the configuration of this example, the number of (R1+R2+R3) bits corresponding in number to the memory macros can be reduced. Therefore, the area of the fuse box 15 can be reduced and it is advantageous for miniaturization of the whole system. For example, eight bits (clocks) can be set in this example while (8+R1+R2+R3=23) bits (clocks) are set in the comparison example. As a result, the number of bits (the number of clocks) can be reduced to approximately ⅓.

(3) It is advantageous in reducing the manufacturing cost.

According to the configuration of this example, even when the number or the configuration of the memory macros 10-1 to 10-3 is changed, it is only required to add or omit the repair information analyzing circuits 12-1 to 12-3. For example, if the number of memory macros is increased by one, it is only required to add one repair information analyzing circuit. Likewise, if the number of memory macros reduced by one, it is only required to omit the repair information analyzing circuit 12-1.

Thus, when the number or the configuration of the memory macros is changed, it is advantageous in reducing the manufacturing cost because it is not necessary to redesign the decode circuit or the like in the memory macro.

Further, in this example, the configuration in which the unit repair information SI is transferred via the bus is not made. Therefore, the interconnection in the chip can be prevented from being complicated and the interconnections between the memory macros 10-1 to 10-3 can be simplified. Further, even if the number of memory macros 10-1 to 10-3 is large, it is advantageous in that the control operation of fetching data can be prevented from becoming complicated.

[Modification 1 (One Example of Serial Input)]

Next, a semiconductor memory device according to a modification 1 of the first embodiment is explained with reference to FIG. 8. The modification 1 relates to an example in which unit repair information SI is serially input to repair information analyzing circuits 12-1 to 12-3 and 12-4 to 12-6 of blocks. In this explanation, the detail explanation for portions that are the same as those of the first embodiment is omitted.

As shown in FIG. 8, the semiconductor integrated circuit according to the modification 1 is different from the first embodiment in that a second memory block B2 including three sets of memory macros 10-4 to 10-6 and repair information analyzing circuits 12-4 to 12-6 is further provided.

In the memory blocks B1, B2, the repair information analyzing circuits 12-1 to 12-3 and 12-4 to 12-6 are serially connected, the input terminals for unit repair information SI are commonly used, and therefore, the unit repair information SI is serially input to the repair information analyzing circuits 12-1 to 12-3 and 12-4 to 12-6. In other words, in the repair information analyzing circuits 12-1 to 12-3 and repair information analyzing circuits 12-4 to 12-6 of the memory blocks B1, B2, the same unit repair information SI is simultaneously transferred. Thus, the repair information analyzing circuits 12-1 to 12-6 of the memory macros 10-1 to 10-3 and memory macros 10-4 to 10-6 are serially connected and since the input terminals of the memory macros 10-3 and 10-6 are commonly used, the unit repair information SI is transferred in parallel.

As described above, according to the semiconductor memory device of the modification 1, the same effects as the effects (1) to (3) can be attained.

Further, the semiconductor memory device according to the modification 1 additionally includes the second memory block B2 including three sets of the memory macros 10-4 to 10-6 and repair information analyzing circuits 12-4 to 12-6. The unit repair information SI is serially input to the repair information analyzing circuits 12-1 to 12-3 and 12-4 to 12-6.

Therefore, the repair information analyzing circuits 12-1 to 12-3 and 12-4 to 12-6 can independently perform the redundancy operation and the configuration in which all of the memory macros 10-1 to 10-6 are serially connected is not made.

As a result, for example, even if the power source control operation of completely turning off the power source is required for the memory block in the semiconductor integrated circuit, it is advantageous in that it is not necessary to change the repair information transferring circuit and it is not necessary to pay particular attention based on a normal hierarchical designing method. The power source control operation of completely turning off the power source is a control operation required for low power consumption or the like, for example.

For example, in the present case, even when the power source of the memory block B1 is completely turned off, unit repair information SI can be transferred to the other memory block B2 like the case where the power source thereof is not turned off. Therefore, it is not necessary to change the repair information transferring circuit according to the on/off state of the power source and it is not necessary to pay attention to connection between the blocks. Thus, according to the configuration of this example, even if the power source control operation of completely turning off the power source is required for a certain memory block, for example, it is possible to easily cope with this case by transferring the unit repair information SI in parallel and it is advantageous in that it is not necessary to change the repair information transferring circuit and it is not necessary to pay particular attention based on a normal hierarchical designing method.

[Modification 2 (One Example in which Memory Identification Information Items are Common)]

Next, a semiconductor memory device according to a modification 2 of the first embodiment is explained with reference to FIG. 9. The modification 2 relates to an example in which memory identification information MID stored in the nonvolatile memory element 25 in the block B2 is commonly used in the repair information analyzing circuits 12-4 to 12-6. The modification 2 relates to an example in which information item is serially input. In this explanation, the detail explanation for portions that are the same as those of the modification 1 is omitted.

Figure 9:
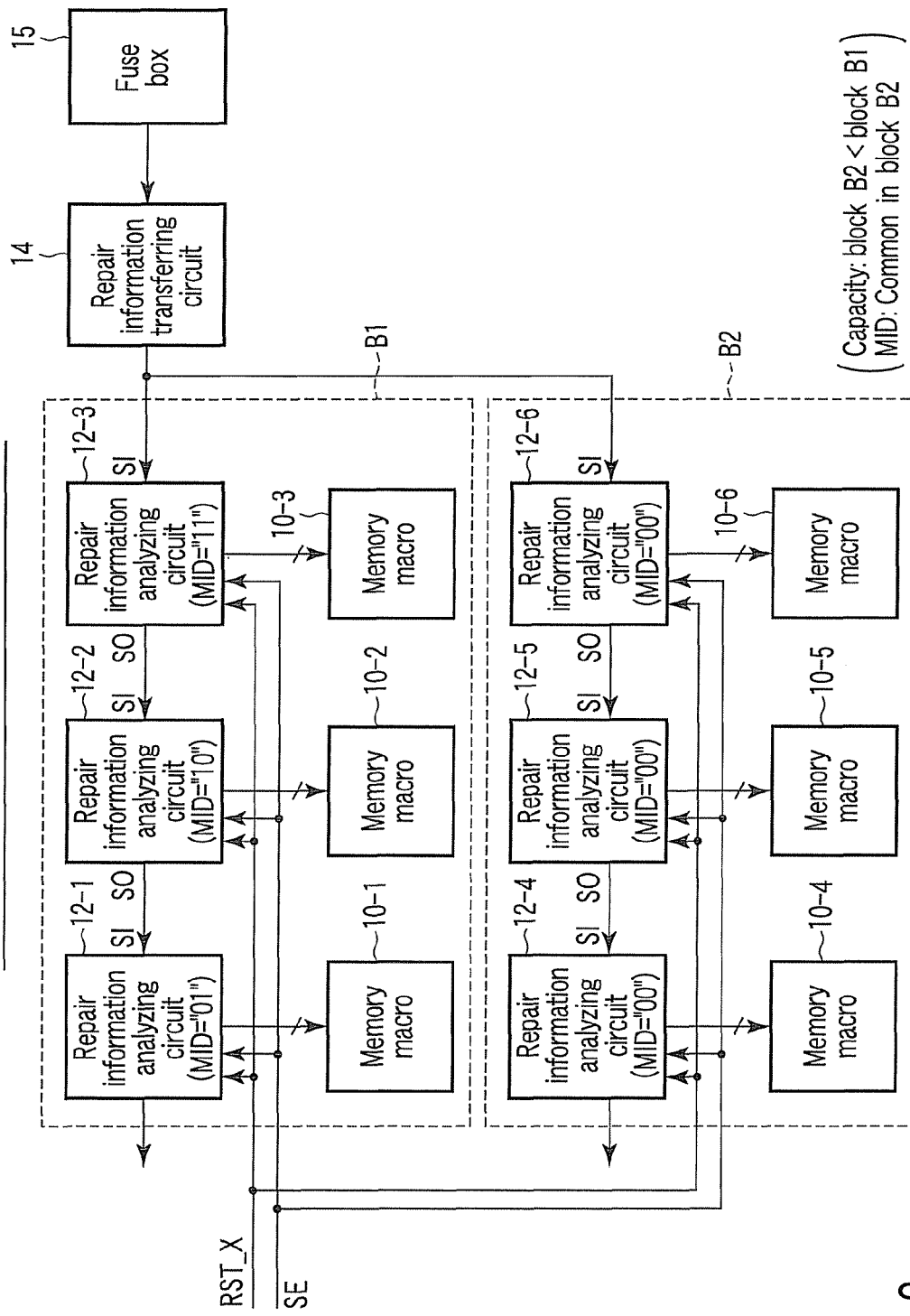
FIG. 9 is a diagram showing a semiconductor integrated circuit according to a second modification.

As shown in FIG. 9, the semiconductor integrated circuit according to the present modification is different from that of the modification 1 in that the memory identification information MID stored in the nonvolatile memory element 25 in the block B2 is commonly used in the repair information analyzing circuits 12-4 to 12-6 and the capacity of the block B2 is smaller than that of the block B1. For example, the capacity of the block B2 is approximately 1 Kbit and the capacity of the block B1 is not smaller than approximately 64 Kbits.

Further, as the memory identification information items MID for the memory macros 10-1 to 10-3 in the memory block B1, inherent values "01", "10", "11" are given. On the other hand, as the memory identification information items MID for the memory macros 10-4 to 10-6 in the memory block B2, a common value "00" is given (MID="00"). Thus, if the unit repair information SI of the memory identification information MID "00" is transferred, the memory macros 10-4 to 10-6 similarly perform the redundancy operation. That is, for example, even if a defective cell is present only in the memory macro 10-4, the memory macros 10-5, 10-6 similarly perform the redundancy operation. However, if the redundancy memory cell array 11R is previously tested, the capacities of the memory macros 10-4 to 10-6 are small and the rate of occurrence of defects is extremely low, then this does not cause a particular problem.

The reason is based on the following ground. That is, the number of memory macros integrated in the semiconductor integrated circuit is yearly increased and if individual memory identification information items MID are given thereto, the bit number for the memory identification information items MID becomes large. Further, if a large number of memory macros are integrated, it is predicted that the number of memory macros 10-4 to 10-6 with small capacity becomes large and the probability that the memory macros 10-4 to 10-6 become defective is extremely low. Therefore, even if the memory macros 10-4 to 10-6 with the small capacity are simultaneously subjected to the repair process, there occurs no problem from the viewpoint of the manufacturing yield, and therefore, the bit number of the memory identification information items MID can be reduced. Thus, the same memory identification information MID is simultaneously given to the memory macros 10-4 to 10-6 for the memory block B2 of the small capacity and the redundancy process is simultaneously performed.

As described above, according to the semiconductor integrated circuit of the modification 2, the same effects as the effects (1) to (3) can be attained.

Further, according to this example, the same memory identification information MID is simultaneously given to the memory macros 10-4 to 10-6 for the memory block B2 of the small capacity and the redundancy process is simultaneously performed.

Therefore, it is effective if the number of memory macros integrated in the semiconductor integrated circuit is increased and individual memory identification information items MID are required to be given thereto.

Second Embodiment

Figure 11:
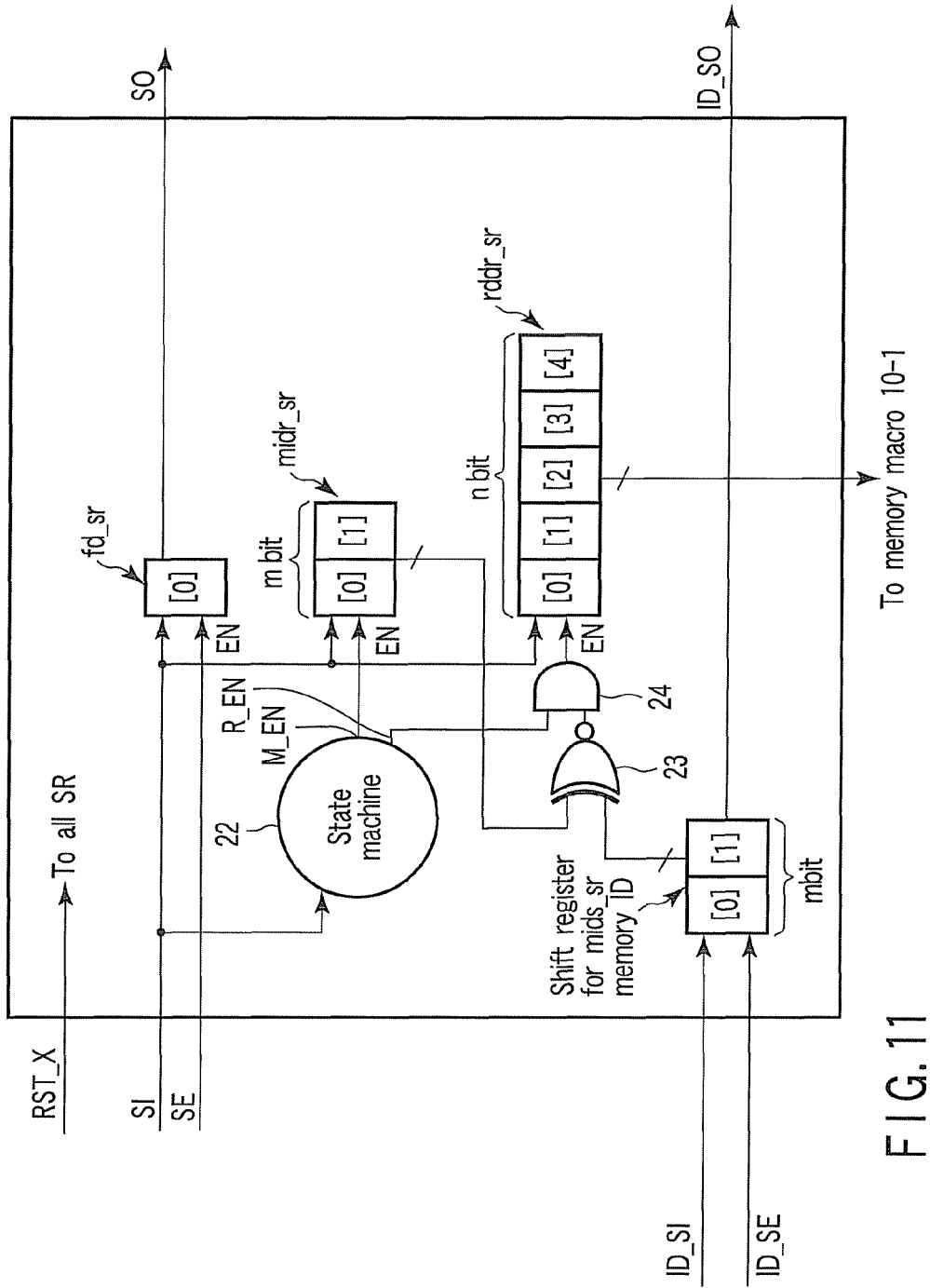
FIG. 11 is a block diagram showing a repair information analyzing circuit in the second embodiment.
Figure 12:
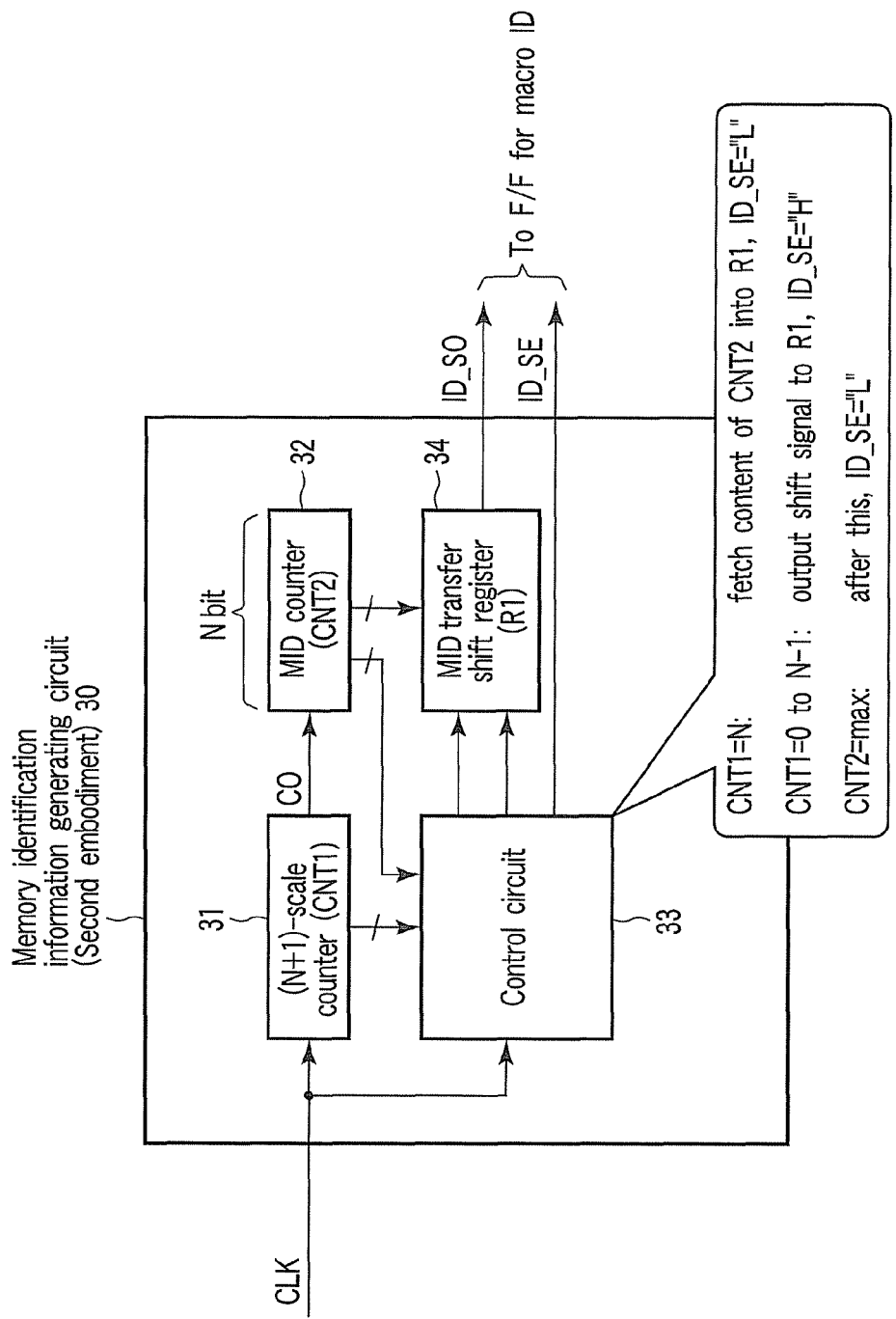
FIG. 12 is a block diagram showing a memory identification information generating circuit in the second embodiment.

One Example in which Memory Identification Information Generating Circuit is further provided Next, a semiconductor memory device according to a second embodiment is explained with reference to FIGS. 10 to 12. The present embodiment relates to an example in which a memory identification information generating circuit is further provided. In this explanation, the detail explanation for portions that are the same as those of the first embodiment is omitted.

Example of Whole Configuration

First, an example of the whole configuration is explained with reference to FIG. 10. As shown in FIG. 10, the semiconductor memory device according to this embodiment is different from that of the first embodiment in that a memory identification information generating circuit 30 is further provided.

The memory identification information generating circuit 30 generates memory identification information items MID to be stored in registers (not shown) in repair information analyzing circuits 12-1 to 12-3 and transfers the thus generated memory identification information items MID as ID_SI to the above registers. Further, the memory identification information generating circuit 30 generates a control signal ID_SE to input the memory identification information items MID. The memory identification information items MID may be inherent data items and serial numbers may be allocated thereto. For example, information items "00", "01", "10" may be assigned to the repair information analyzing circuits 12-1 to 12-3 as the memory identification information items MID. As will be described later, the memory identification information generating circuit 30 can be configured by a relatively simple circuit.

As described above, if it is difficult to give the memory identification information items MID without duplication, for example, if the chip design of the semiconductor integrated circuit is made in a hierarchical form by using the memory identification information generating circuit 30, the inherent memory identification information items MID can be generated and transferred by means of the memory identification information generating circuit 30.

Example of Configuration of Repair Information Analyzing Circuit

Next, the repair information analyzing circuit 12-1 of this example is explained with reference to FIG. 11. As shown in FIG. 11, in the first embodiment, the memory identification information items MID are fixedly stored in the nonvolatile memory element 25. Therefore, it is necessary to give the memory identification information items MID of different values for the respective memory macros at the design stage.

On the other hand, the configuration of this example is different from that of the first embodiment in that it is not necessary to determine the memory identification information items MID at the design stage and a memory ID shift register mids_sr of a bit number capable of determining the number of memory macros is provided.

The memory ID shift register mids_sr fetches shift-in data ID_SI when a shift enable signal ID_SE becomes effective and, at the same time, outputs the content held therein as shift-out data ID_SO. In this case, the clock signal is omitted and is not shown. The other circuit configuration is the same as described above.

Example of Configuration of Memory Identification Information Generating Circuit Next, an example of the configuration of the memory identification information generating circuit 30 is explained with reference to FIG. 12. The memory identification information generating circuit 30 is configured to allocate memory identification information items MID of serial numbers.

In this example, the memory identification information generating circuit 30 includes two counters (CNT1, CNT2) 31, 32, one transfer register (R1) 34 and a control circuit 33 that controls the above units. All of the counters 31, 32 and register 34 are initialized to "0" by the initial resetting operation. Part of the clock signals and the reset signal are omitted.

In this embodiment, the bit number of the memory identification information MID is set to N bits. Therefore, the output CO (Carry Out) of the counter (CNT1) 31 to the counter 32 is connected to an enable terminal of the counter (CNT2) 32. That is, the counter (CNT1) 31 is counted up for each clock.

The counter (CNT2) 32 is counted up for every (N+1) clocks.

The control circuit 33 outputs a shift signal to the MID transfer shift register (R1) 34, shifts out the content of the register R1 and sets ID_SE to "H" when the content of the counter (CNT1) 31 is set to the clock of 0 to (N−1).

Then, when the content of the counter (CNT1) 31 is set to the N clock, it generates a signal of fetching the content of the counter (CNT2) 32 into the register R1 and sets ID_SE to "L".

Finally, after the memory identification information MID (max) is output, that is, after the content of the counter (CNT2) 32 is set to maximum, ID_SE is kept set at "L".

Thus, according to the above circuit configuration, the memory identification information items MID can be generated and output in an order starting from 0.

Effects of Present Embodiment

As described above, according to the semiconductor integrated circuit of this embodiment, the same effects as the effects (1) to (3) can be attained. Further, according to this example, the following effect (4) can be attained.

(4) It is advantageous when it is difficult to provide the memory identification information items MID without duplication, for example, when the chip design of the semiconductor integrated circuit is made in a hierarchical form.

In this case, in the configuration of the first embodiment, it is necessary to provide the memory identification information items MID inherent to the memory macros 10-1 to 10-3 to the nonvolatile memory element 25 at the design stage. At this time, if the chip design is made based on the divisional design (hierarchical design) for respective memory blocks, it is easy to provide the inherent memory identification information items in the respective memory blocks, but it is sometimes difficult to provide the inherent memory identification information items MID for the chip.

The semiconductor integrated circuit of this example further includes the memory identification information generating circuit 30. Further, each of the repair information analyzing circuits 12-1 to 12-3 of this example includes the memory ID shift register mids_sr of a bit number capable of identifying the number of memory macros.

Therefore, it is not necessary to determine the memory identification information MID at the design stage and, for example, the memory identification information items MID can be given to the repair information analyzing circuits 12-1 to 12-3 by means of the memory identification information generating circuit 30 at the power-on time of the system. In this case, however, it is necessary to design the memory identification information generating circuit itself at the final stage of the chip design in which the hierarchical design has finished.

Thus, according to the configuration of this example, it is advantageous in that the inherent memory identification information items MID can be generated and transferred by means of the memory identification information generating circuit 30 when it is difficult to provide the memory identification information items MID without duplication, for example, when the chip design of the semiconductor integrated circuit is made in a hierarchical form.

[Modification 3 (One Example of Serial Input)]

Next, a semiconductor memory device according to a modification 3 of the second embodiment is explained with reference to FIG. 13. The modification 3 relates to an example in which unit repair information SI and outputs ID_SI, ID_SE of the memory identification information generating circuit 30 are serially input to the repair information analyzing circuits 12-1 to 12-3 and 12-4 to 12-6 of the blocks. In this explanation, the detail explanation for portions that are the same as those of the second embodiment is omitted.

As shown in FIG. 13, the semiconductor integrated circuit of the modification 3 is different from that of the second embodiment in that it further includes a second memory block B2 including three sets of memory macros 10-4 to 10-6 and repair information analyzing circuits 12-4 to 12-6.

In the memory blocks B1, B2, all of the repair information analyzing circuits 12-1 to 12-3, 12-4 to 12-6 are serially connected and commonly have the input terminals for unit repair information SI and the unit repair information SI is serially input to the repair information analyzing circuits 12-1 to 12-3 and 12-4 to 12-6. In other words, the same unit repair information SI is simultaneously transferred to the repair information analyzing circuits 12-1 to 12-3 and 12-4 to 12-6 of the blocks B1, B2. Thus, since the repair information analyzing circuits 12-1 to 12-3 and repair information analyzing circuits 12-4 to 12-6 of the memory macros 10-1 to 10-3 and memory macros 10-4 to 10-6 are respectively serially connected and the input terminals is commonly used for the memory macros 10-3 and 10-6, the unit repair information SI is transferred in parallel.

On the other hand, the output ID_SI of the memory identification information generating circuit 30 is serially input to the repair information analyzing circuits 12-1 to 12-6. Further, the output ID_SE of the memory identification information generating circuit 30 is input to all of the repair information analyzing circuits 12-1 to 12-6. With this configuration, inherent memory identification information items MID can be given to the memory macros 10-1 to 10-6.

As described above, according to the semiconductor integrated circuit of this embodiment, the same effects as at least the effects (1) to (4) can be attained.

Further, according to this example, even if the power source control operation of, for example, completely turning off the power source is required for the memory block in the semiconductor integrated circuit, it is advantageous in that it is not necessary to change the repair information transferring circuit and it is not necessary to pay particular attention based on a normal hierarchical designing method. For example, in the case of this example, even when the power source of the memory block B1 is completely turned off, unit repair information SI can be transferred to the other memory block B2 like the case where the power source thereof is not turned off. Therefore, it is not necessary to change the repair information transferring circuit according to the on/off state of the power source and it is not necessary to pay attention to connection between the blocks. Thus, according to the configuration of this example, even if the power source control operation of, for example, completely turning off the power source is required for a certain memory block, it is possible to easily cope with this case simply by transferring the unit repair information items SI in parallel and it is advantageous in that it is not necessary to change the repair information transferring circuit and it is not necessary to pay particular attention based on a normal hierarchical designing method. However, in the case of this example, it is necessary to pay attention to connection between the blocks for the transferring path of memory identification information or turn on the power sources of all of the memory blocks during the transferring period of memory identification information.

[Modification 4 (One Example in which Memory Identification Information Items are Commonly Given)]

Next, a semiconductor memory device according to a modification 4 of the second embodiment is explained with reference to FIGS. 14, 15. The modification 4 relates to an example in which memory identification information items MID to be transferred to the repair information analyzing circuits 12-4 to 12-6 in the block B2 are commonly given by the memory identification information generating circuit 30. In this explanation, the detail explanation for portions that are the same as those of the modification 3 is omitted.

Figure 14:
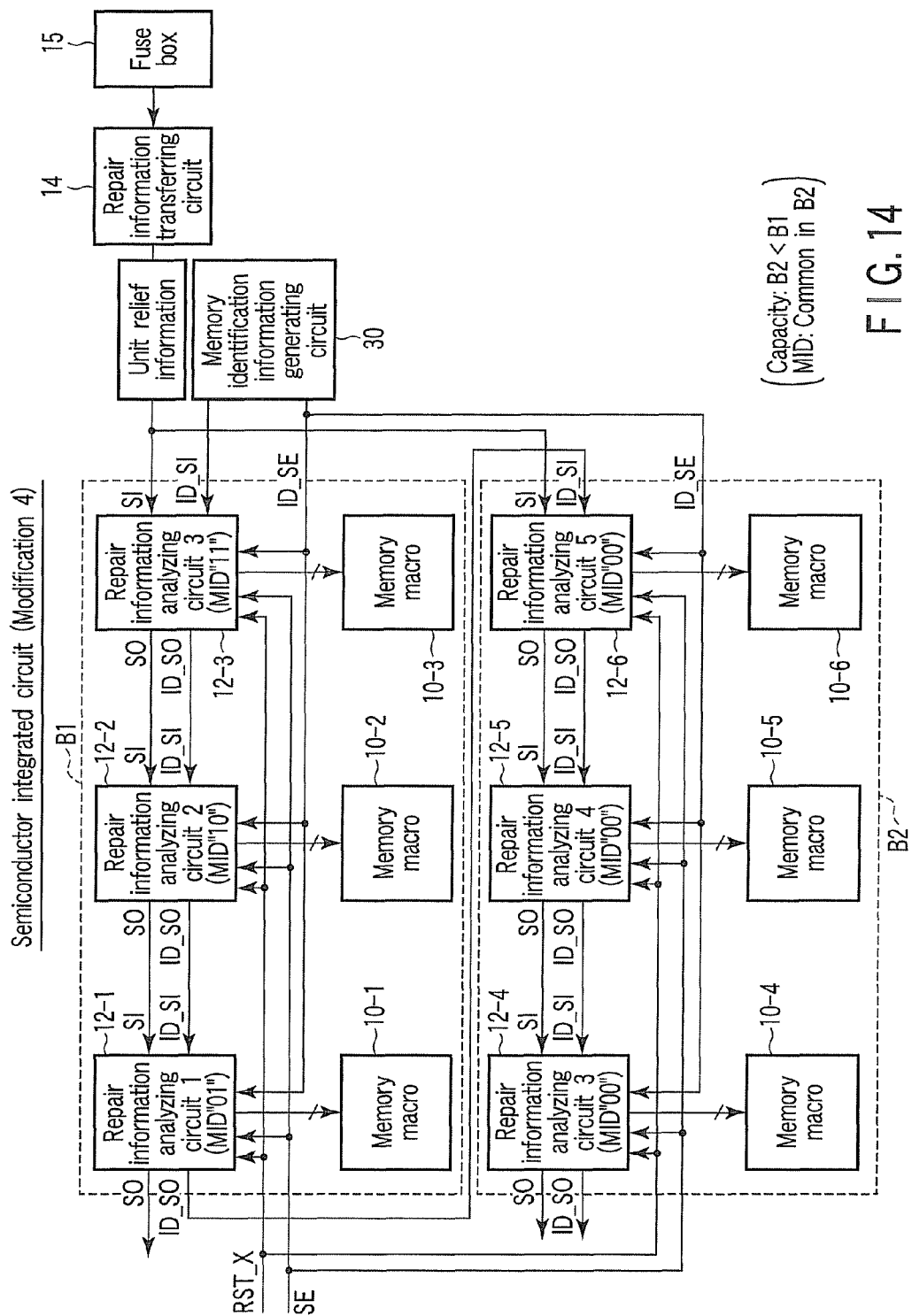
FIG. 14 is a diagram showing a semiconductor integrated circuit according to a fourth modification.

As shown in FIG. 14, the semiconductor integrated circuit of the present modification 4 is different from that of the modification 3 in that memory identification information items MID transferred to the repair information analyzing circuits 12-4 to 12-6 in the block B2 are commonly given by the memory identification information generating circuit 30 and the capacity of the memory block B2 is smaller than that of the memory block B1. For example, the capacity of the memory block B2 is approximately 1 Kbit and the capacity of the memory block B5 is not smaller than approximately 64 Kbits.

Therefore, common memory identification information MID"00" is given as the memory identification information items MID for the memory macros 10-4 to 10-6 of the memory block B2 by the memory identification information generating circuit 30 (MID="00"). When unit repair information SI of the memory identification information MID"00" is transferred, the memory macros 10-4 to 10-6 perform the same redundancy operation. That is, for example, a defective cell is present only in the memory macro 10-4, the memory macros 10-5, 10-6 perform the same redundancy operation. However, if the redundancy memory cell array 11R is previously tested, the capacities of the memory macros 10-4 to 10-6 are small and the rate of occurrence of defects is extremely low, then this does not cause a particular problem as described before.

Example of Configuration of Memory Identification Information Generating Circuit Next, an example of the configuration of the memory identification information generating circuit 30 according to the modification 4 is explained with reference to FIG. 15.

It is necessary for the memory identification information generating circuit 30 to select part of numbers from the numbers of memory identification information items MID sequentially generated and rewrite the same to the same numbers.

The memory identification information generating circuit 30 is different from that of the second embodiment in that a ROM table 41 is further provided. The input of the ROM table 41 is connected to the output of the counter 32 and the output thereof is connected to the MID transfer shift register 34.

With the above configuration, the memory identification information generating circuit 30 of this example generates memory identification information items MID of the same number by converting the number by using the ROM table 41 based on the content of the counter (CN2) 32. In this case, if the conversion process can be performed in a relatively simple manner, the process can be performed only by means of a combination circuit.

As described above, according to the semiconductor integrated circuit of the modification 4, the same effects as at least the effects (1) to (4) can be attained.

Further, according to this example, the same memory identification information MID can be simultaneously supplied to the memory macros 10-4 to 10-6 for the memory block B2 having small capacity by means of the memory identification information generating circuit 30 and the redundancy process can be simultaneously performed.

Therefore, it is effective in a case where the number of memory macros integrated in the semiconductor integrated circuit increases and it is necessary to supply individual memory identification information items MID to the memory macros.

COMPARISON EXAMPLE

Figure 16:
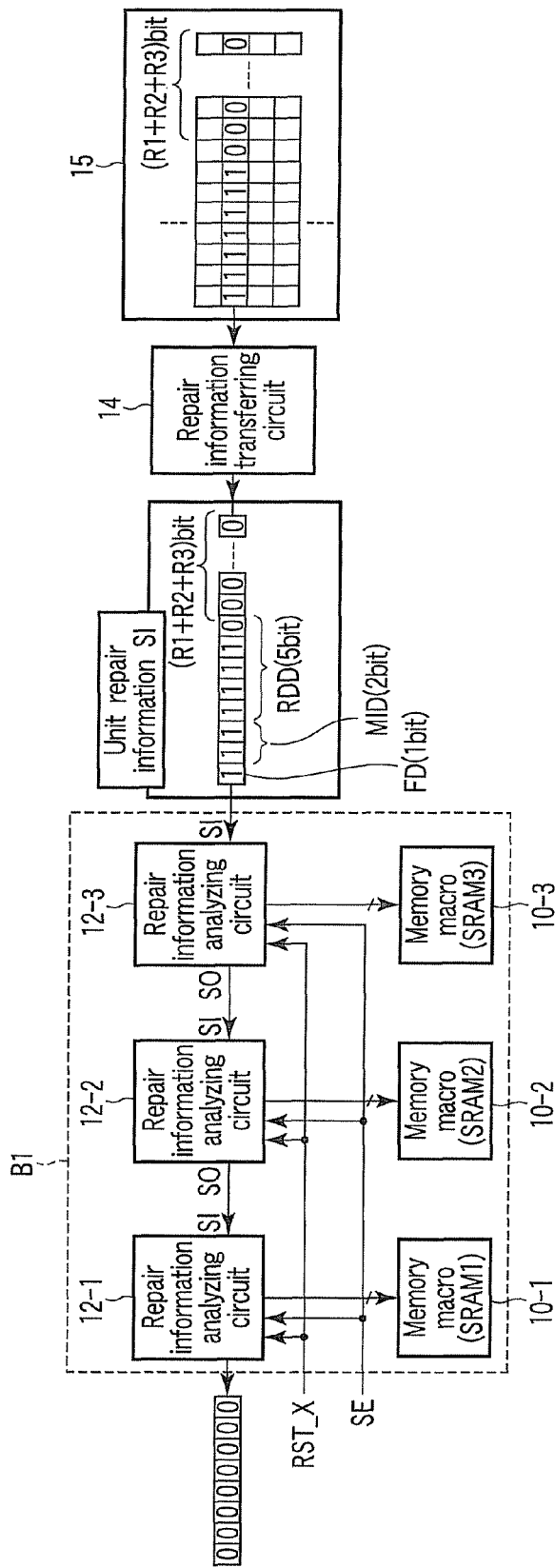
FIG. 16 is a block diagram showing a semiconductor integrated circuit according to a comparison example.

Next, a semiconductor memory device according to a comparison example is explained with reference to FIG. 16 to compare the same with the semiconductor memory devices of the above embodiments and modifications. In this explanation, the detail explanation for portions that are the same as the portions described above is omitted.

With the configuration of the comparison example, the repair information analyzing circuits 12-1 to 12-3 have no state machines and repair information RDD is fetched when memory identification information items coincide with each other. At the same time, all of the repair information items are cleared and output to the next repair information analyzing circuit. Thus, successive repair information items cannot be transferred. Further, the repair information analyzing circuits 12-1 to 12-3 have registers of R1 to R3 bits provided therein and repair information is transferred via the registers. Therefore, in order to transfer unit repair information SI, it becomes necessary to use (8+R1+R2+R3) clocks. As a result, in order to transfer all of the repair information items, it becomes necessary to use (8+R1+R2+R3)×(the number of repair information items) clocks.

In the case of the comparison example, at the time of R1=5, R2=6 and R3=7, for example, (8+R1+R2+R3) clocks are required to transfer the unit repair information SI. However, in the above embodiments and modifications, the number of clocks can be set to (8+3=11). As a result, in the above embodiments and modifications, the number of clocks can be reduced to approximately ½.

Thus, since the clock number and transfer number of unit repair information SI in the semiconductor memory device of the comparison example are increased in comparison with those of the semiconductor memory devices according to the above embodiments and modifications, the semiconductor memory device of the comparison example is disadvantageous in enhancing the operation speed.

Further, in the repair information transferring circuit of the comparison example, it is necessary to add "0" data of (R1+R2+R3) bits to repair information stored in the fuse box and perform the control operation of repeatedly transferring repair information items by the number thereof. Therefore, the repair information transferring circuit of the comparison example becomes complicated in comparison with the repair information transferring circuits of the above embodiments and modifications and the circuit area may be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    a memory macro which includes a main memory cell array having a plurality of memory cells, a redundancy memory cell array having a plurality of redundancy cells and a redundancy repair mechanism;
    a repair information analyzing circuit having a nonvolatile memory element which stores memory identification information used to identify the memory macro; and
    a repair information transferring circuit which transfers unit repair information configured by at least the memory identification information and repair information to the repair information analyzing circuit, the repair information analyzing circuit fetching the repair information of the transferred unit repair information therein, outputting the repair information to the memory macro having the redundancy repair mechanism and subjecting the memory macro to a redundancy repair process by means of the redundancy repair mechanism of the memory macro in a case where the memory identification information of the transferred unit repair information coincides with the memory identification information stored in the nonvolatile memory element,
    wherein the repair information analyzing circuit includes a first register which stores the memory identification information, a second register which stores the repair information, and a state machine having a rest state, a memory information fetching state, and a repair information fetching state,
    the unit repair information further contains mark information used as a mark required for the state machine to start state transition, and
    the state machine is set in the rest state before the unit repair information is input, transited to the memory information fetching state when mark information of the unit repair information transferred is set to a preset value, and transited to the repair information fetching state in which the unit repair information transferred is fetched during a preset clock period.

2. The circuit according to claim 1, further comprising a memory block having plural sets of the memory macros and repair information analyzing circuits, wherein all of the repair information analyzing circuits in the memory block are serially connected to permit the memory identification information to be serially input.

3. The circuit according to claim 1, further comprising a first memory block having plural sets of the memory macros and repair information analyzing circuits, and a second memory block having plural sets of the memory macros and repair information analyzing circuits, wherein all of the repair information analyzing circuits in each of the first and second memory blocks are serially connected and an input terminal of the memory identification information items of the first and second memory blocks is commonly used by the first and second memory blocks to permit the memory identification information to be input to the first and second memory blocks in parallel.

4. The circuit according to claim 3, wherein the memory identification information stored in the second block is commonly used by the repair information analyzing circuits of the second block and capacity of the second memory block is smaller than that of the first memory block.

5. The circuit according to claim 1, wherein the memory macro and the repair information analyzing circuit are connected one-on-one.

6. The circuit according to claim 1, wherein the repair information transferring circuit transmits the unit repair information to the repair information analyzing circuit through a data line.

7. A semiconductor integrated circuit comprising:
    a memory macro which includes a main memory cell array having a plurality of memory cells, a redundancy memory cell array having a plurality of redundancy cells and a redundancy repair mechanism;
    a repair information analyzing circuit having a register which stores memory identification information used to identify the memory macro;
    a repair information transferring circuit which transfers unit repair information configured by at least the memory identification information and repair information to the repair information analyzing circuit; and
    a memory identification information generating circuit which generates the memory identification information to be stored in the register and transfers the thus generated memory identification information to the register;
    wherein the repair information analyzing circuit fetches the repair information of the transferred unit repair information therein, makes a replacement to the redundancy cell according to the repair information and relieves the memory macro in a case where the memory identification information of the transferred unit repair information coincides with the memory identification information stored in the register,
    wherein the repair information analyzing circuit includes a first register which stores the memory identification information, a second register which stores the repair information, and a state machine having a rest state, a memory information fetching state and a repair information fetching state,
    the unit repair information further contains mark information used as a mark required for the state machine to start state transition, and
    the state machine is set in the rest state before the unit repair information is input, transited to the memory information fetching state when mark information of the unit repair information transferred is set to a preset value, and transited to the repair information fetching state in which the unit repair information transferred is fetched during a preset clock period.

8. The circuit according to claim 7, further comprising a memory block having plural sets of the memory macros and repair information analyzing circuits, wherein all of the repair information analyzing circuits in the memory block are serially connected to permit the memory identification information to be serially input.

9. The circuit according to claim 7, further comprising a first memory block having plural sets of the memory macros and repair information analyzing circuits, and a second memory block having plural sets of the memory macros and repair information analyzing circuits, wherein all of the repair information analyzing circuits in each of the first and second memory blocks are serially connected and an input terminal of the memory identification information items of the first and second memory blocks is commonly used by the first and second memory blocks to permit the memory identification information items to be input to the first and second memory blocks in parallel.

10. The circuit according to claim 9, wherein the memory identification information stored in the second block is commonly used by the repair information analyzing circuits of the second block and capacity of the second memory block is smaller than that of the first memory block.

11. The circuit according to claim 7, wherein the memory macro and the repair information analyzing circuit are connected one-on-one.

12. The circuit according to claim 7, wherein the repair information transferring circuit transmits the unit repair information to the repair information analyzing circuit through a data line.

* * * * *